(12) United States Patent
Miyata

(10) Patent No.: US 6,902,762 B2
(45) Date of Patent: Jun. 7, 2005

(54) METHOD AND DEVICE FOR PROCESSING SUBSTRATE

(75) Inventor: Akira Miyata, Kikuchi-gun (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 10/425,939

(22) Filed: Apr. 30, 2003

(65) Prior Publication Data

US 2003/0216053 A1 Nov. 20, 2003

(30) Foreign Application Priority Data

May 1, 2002 (JP) ........................................ 2002-129976

(51) Int. Cl.⁷ .............................................. B65G 49/07
(52) U.S. Cl. ..................... 427/240; 427/425; 118/52; 438/758; 414/800; 414/806; 414/935
(58) Field of Search ................................ 427/240, 425; 118/52, 320; 438/758; 414/935, 800, 806

(56) References Cited

U.S. PATENT DOCUMENTS 4,982,694 A * 1/1991 Moriyama .................. 118/697
5,127,362 A * 7/1992 Iwatsu et al. ............... 118/667
5,815,762 A * 9/1998 Sakai et al. ................. 396/611
6,338,582 B1   1/2002 Ueda .......................... 396/611

FOREIGN PATENT DOCUMENTS

JP        5-190436 A  *  7/1993

OTHER PUBLICATIONS

JPO computer translation of JP 5–190436 A, published Jul. 1993.*

* cited by examiner

*Primary Examiner*—Kirsten Jolley
(74) *Attorney, Agent, or Firm*—Oblon, Spivak, McClelland, Maier & Neustadt, P.C.

(57) ABSTRACT

A substrate processing method comprises stopping the transfer of a head substrate of a succeeding lot for a period which is an integral multiple of a cycle time after a last substrate of a preceding lot is transferred from a cassette section to a processing section by a transfer mechanism, executing dummy dispense of a predetermined time by a solution processing unit during the substrate transfer stop period, and transferring the head substrate of the succeeding lot to the processing section by the transfer mechanism after the dummy dispense.

14 Claims, 11 Drawing Sheets

| CS | TRS | CPL | COT | PAB~CS |
|----|-----|-----|-----|--------|
| B01 | A25 | A24 | A23 | ⟶ |
| B01 | DD | A25 | A24 | ⟶ |
| B02 | B01 | DD | A25 | ⟶ |
| B03 | B02 | B01 | DD | ⟶ |
| ⋮ | ⋮ | ⋮ | ⋮ | ⋮ |

| CS | TRS | CPL | COT | PAB~CS |
|---|---|---|---|---|
| B01 | A25 | A24 | A23 | → |
| B01 | DD | A25 | A24 | → |
| B02 | B01 | DD | A25 | → |
| B03 | B02 | B01 | DD | → |
| ⋮ | ⋮ | ⋮ | ⋮ | ⋮ |

FIG. 10A

| CS | TRS | CPL | COT | PAB~CS |
|---|---|---|---|---|
| B01 | DD | DD | A25 | → |
| B02 | B01 | DD | DD | → |
| B03 | B02 | B01 | DD | → |
| ⋮ | ⋮ | ⋮ | ⋮ | ⋮ |

FIG. 10B

METHOD AND DEVICE FOR PROCESSING SUBSTRATE

CROSS-REFERENCE TO RELATED APPLICATIONS

This application is based upon and claims the benefit of priority from the prior Japanese Patent Application No. 2002-129976, filed May 1, 2002, the entire contents of which are incorporated herein by reference.

BACKGROUND OF THE INVENTION

1. Field of the Invention

The present invention relates to a method and a device for processing a substrate which are used in photolithography for forming a predetermined circuit pattern on a substrate for a semiconductor wafer or a liquid crystal display (LCD).

2. Description of the Related Art

The substrate processing device is disclosed in, for example, U.S. Pat. No. 6,444,029B1. Operations of a main carrying mechanism and a semiconductor wafer in the conventional device will be described by referring to FIG. 1. Two main carrying mechanisms 15A, 15B cooperatively carry a wafer W in a sequence of a cassette stage 11→a TRS1→a CPL1→a coating unit (COT)→a TRS2→an LHP1→a CPL2→an interface section 1B on an approach route. Then, the main carrying mechanisms 15A, 15B turn around to change directions, and cooperatively carry the wafer W in a sequence of the interface section 1B→a PEB→a CPL3→a developing unit (DEV)→an LHP2→a TRS3→a TRS4→the cassette stage 11 on a return route. The TRS1, TRS4 are transfer units to transfer the wafer between an auxiliary carrying mechanism (not shown) and the main carrying mechanism 15A. The TRS2, TRS3 are transfer units to transfer the wafer between the main carrying mechanisms 15A, 15B.

One main carrying mechanism 15A moves along a cyclic route of the TRS1→the CPL1→the coating unit (COT)→the TRS2→the TRS3→the TRS4→the TRS1 in a processing section 1A. One round of the main carrying mechanism 15A along this cyclic route is called "one cycle movement of the main carrying mechanism 15A". The other main carrying mechanism 15B moves along a cyclic route of the TRS2→the LHP1→the CPL2→the PEB→the CPL3→the developing unit (DEV)→the LHP2→the TRS3→the TRS2 in the processing section 1A. One round of the main carrying mechanism 15B along this cyclic route is called "one cycle movement of the main carrying mechanism 15B". Operations of the main carrying mechanisms 15A, 15B during the cycle movements are controlled by a predetermined program of a control section, and forward movements and stopping are repeated without any backtracking on the cyclic routes.

Each of the main carrying mechanisms 15A, 15B comprises two upper and lower arms to load/unload the wafer W on a processing unit. For example, the main carrying mechanism 15A receives an n-th wafer Wn from the TRS1, and carries it to the CPL1 of a next step. Then, the mechanism 15A makes one cycle movement along the cyclic route, and returns to the TRS1 to receive a next (n+1)-th wafer W(n+1) therefrom.

Thus, for each one cycle movement of the main carrying mechanism 15A, wafers W are carried one by one from the cassette section 11 into the processing section 1A through the TRS1. Further, for each one cycle movement of the main carrying mechanism 15A, the wafers W are carried one by one from the processing section 1A out to the cassette section 11 through the TRS4.

On the other hand, for each one cycle movement of the main carried mechanism 15B, the wafers W are transferred one by one to the interface section 1B through the CPL1. Further, for each one cycle movement of the main carrying mechanism 15B, the wafers W are received one by one from the interface unit 1B through the PEB unit. By sequentially repeating these operations, a predetermined process is carried out for all the wafers of lots.

For example, at the coating unit (COT), a resist is spin-coated on the wafer W. At this time, a resist solution in a tank is fed by pressure through a pump to a supply line, and then supplied through the supply line into a nozzle. Here, if supply of the resist solution to the wafer W is stopped, the resist solution stays in the nozzle or the supply line for a long time, which changes the properties (mainly, the solvent volatilizes, which changes the resist viscosity). Thus, between a preceding lot and a succeeding lot, i.e., while the resist is not coated on the wafer W, a so-called dummy dispense is carried out to discharge the staying resist solution from the nozzle or the supply line. This dummy dispense is similarly carried out in the developing unit (DEV).

As described above, the main carrying mechanisms 15A, 15B only move forward or stop without backtracking on the cyclic routes. In this case, if the dummy dispense is carried out at the coating unit (COT), the main carrying mechanism 15A stops at the coating unit (COT) to be set on standby until the dummy dispense is finished. Similarly, if the dummy dispense is carried out at the developing unit (DEV), the other main carrying mechanism 15B stops at the developing unit (DEV) to be set on standby.

Now, explanation is made by taking an example of carrying out the dummy dispense at the coating unit (COT) between a preceding lot A (1 lot: 25 wafers) and a succeeding lot B. When resist coating is finished on a last wafer A25 of the preceding lot A, the main carrying mechanism 15A takes out a head wafer B01 of the succeeding lot B from the CPL1 of a previous step by one arm, and the wafer A25 from the coating unit (COT) by the other arm.

On the other hand, there is a wafer A24 of the preceding lot A in the TRS2 of a next step of the coating unit (COT). This wafer A24 is carried to the LHP1 of a next step by the other main carrying mechanism 15B. Accordingly, after the wafer A24 is taken out from the TRS2, the main carrying mechanism 15A transfers the wafer A25 to the TRS2 by the other arm.

Subsequently, one arm of the main carrying mechanism 15A transfers the wafer B01 to the coating unit. However, if the dummy dispense is carried out at the coating unit (COT), since the wafer B01 cannot be carried into the coating unit (COT), the main carrying mechanism 15A is set on standby while holding the wafer B01. Therefore, carrying of the wafer B01 by the main carrying mechanism 15A stops.

Even if the main carrying mechanism 15A carries the wafer B01 into the coating unit (COT) before the dummy dispense, finally the main carrying mechanism 15A stops during the execution of the dummy dispense or the coating of the resist solution on the wafer B01. Thus, the stopping time of the main carrying mechanism 15A becomes longer by an amount necessary for the dummy dispense at the coating unit (COT). The same occurs in the main carrying mechanism 15B when the dummy dispense is carried out at the developing unit (DEV). On the whole, therefore, transfer of the wafer W is not smooth between the main carrying mechanisms 15A, 15B in the processing section 1A, which impedes improvement of throughput.

BRIEF SUMMARY OF THE INVENTION

An object of the present invention is to provide a method and a device for processing a substrate, which can smoothly transfer the substrate among a plurality of main carrying mechanisms to improve throughput even when dummy dispense is carried out at a solution processing unit (resist coating unit, developing unit, BARC coating unit or the like).

A substrate processing method of the present invention comprises: transferring substrates one by one from a cassette section to a processing section by a transfer mechanism at timing of each predetermined cycle time, the cassette section having a cassette which houses a plurality of substrates constituting lots, the processing section including a plurality of solution processing units and a plurality of substrate carrying mechanisms; carrying the substrates in sequence along a cyclic route of the processing section by the substrate carrying mechanisms; executing a plurality of processes for the substrates in sequence; carrying the processed substrates from the processing section to the cassette section; and executing dummy dispense by at least one of the solution processing units in a period between a process of a preceding lot substrate and a process of a succeeding lot substrate, and the method is characterized by comprising:

(i) stopping the transfer of a head substrate of the succeeding lot for a period which is an integral multiple of the cycle time, after a last substrate of the preceding lot is transferred from the cassette section to the processing section by the transfer mechanism;

(ii) executing dummy dispense of a predetermined dummy dispense time by the solution processing unit during the substrate transfer stop period; and (iii) transferring the head substrate of the succeeding lot to the processing section by the transfer mechanism after the dummy dispense.

The substrate processing method of the present invention further comprises: (iv) making a recipe to control an operation of each of the transfer mechanism, the substrate carrying mechanisms and the solution processing units and a recipe to define initial conditions, and storing the made recipes; (v) selecting the necessary recipe from the stored recipes; (vi) setting the cycle time and the dummy dispense time based on the selected recipe; (vii) obtaining the substrate transfer stop period based on the cycle time and the dummy dispense time; and (viii) controlling operations of the transfer mechanism, the substrate carrying mechanisms and the solution processing units by using the substrate transfer stop period, the cycle time and the dummy dispense time, thereby causing at least one of the solution processing units to execute the dummy dispense during the substrate transfer stop period.

A substrate processing device of the present invention comprises:

a cassette section from and into which a cassette housing a plurality of substrates constituting lots is taken and put;

a processing section to execute a plurality of processes for the substrates in sequence;

a plurality of solution processing units disposed in the processing section to process the substrates by using a predetermined processing solution;

a transfer mechanism to take out the substrates from the cassette of the cassette section and to transfer the substrates to the processing section;

substrate carrying mechanisms to receive the substrates from the transfer mechanism, to carry the substrates in sequence in the processing section, and to carry the substrates out to the cassette section;

a cyclic route disposed in the processing section, along which the substrate carrying mechanisms make cycle movements; and a control section to make recipes which define operations of the transfer mechanism, the substrate carrying mechanisms and the solution processing units, to obtain a cycle time and a dummy dispense time based on the recipes, to obtain a substrate transfer stop period based on the recipes, the cycle time and the dummy dispense time, to stop transfer of a substrate of a succeeding lot from the cassette section to the processing section during the substrate transfer stop period, to cause the solution processing unit to execute dummy dispense during the substrate transfer stop period, and then to transfer the substrate of the succeeding lot to the processing section by the transfer mechanism.

The control section comprises: a recipe making section to make a recipe to define an operation of each of the transfer mechanism, the substrate carrying mechanisms and the solution processing units; a recipe storing section to store the recipes made by the recipe making section; a recipe selecting section to select and call the recipes stored in the recipe storing section; a cycle time calculating section to calculate the cycle time based on the recipes; a dummy dispense calculating section to calculate the dummy dispense time based on the recipes; a transfer stop period calculating section to calculate the substrate transfer stop period based on the recipes, the cycle time and the dummy dispense time; a counting section to count the number of the processed substrates; and a dummy dispense determining section to decide execution timing of the dummy dispense based on the counted number of the processed substrates and the transfer stop period.

According to the present invention, since the transfer of substrates from the cassette section to the processing section is stopped for the predetermined period and, during this stop period, the dummy dispense is executed by the solution processing unit, no substrates stay on the cyclic route. Therefore, it is possible to prevent overbaking of a resist film in a heating device caused by, for example, delayed taking-out of the substrate from the heating device.

Here, the "cycle time" is a time for each of the substrate carrying mechanisms (main carrying mechanisms) to make a round along the cyclic route and return to a starting point irrespective of substrate holding. In other words, the "cycle time" is from transfer of an n-th substrate in the cassette from the transfer mechanism to the substrate carrying mechanism to transfer of a next (n+1)-th substrate in the cassette from the transfer mechanism to the substrate carrying mechanism in the case where the substrate is held.

The "dummy dispense time" is a sum total of a discharging and disposing time of a process solution from the nozzle and nozzle operation time in the solution processing unit.

The "process of the substrates in sequence" is execution of a preceding process for the substrates first and then execution of a succeeding process in order defined by predetermined recipes. This means that a process of substrates outside the order defined by a predetermined process recipe is not included, for example, no reversal occurs in order between the preceding process and the succeeding process in the processing section.

The "carrying of the substrates in sequence" is forward-direction carrying of the substrates by advancing and stopping of the substrate carrying mechanism repeated in order defined by predetermined recipes. This means that carrying of substrates outside the order defined by a predetermined carrying recipe is not included, for example, the substrate carrying mechanism does not backtrack in the processing section to carry the substrates in a backward direction.

The "substrate transfer stop period" is a period for stopping the transfer of the substrates from the cassette section to the processing section. In other words, this period is equivalent to a period of no transfer of substrates by the transfer mechanism to the substrate carrying mechanism, i.e., an empty cycle carrying period where the substrate carrying mechanism moved along the cyclic route for a time which is an integral multiple of the cycle time in a state of holding no substrates. This period (number of empty cycle times) is calculated based on the cycle time and the dummy dispense time given by predetermined recipes. For example, if the cycle time is A seconds and the dummy dispense time is B seconds, first, an integer x (including 0) which satisfies a relation of an inequality Axx<B is obtained. Then, 1 is added to the integer x to obtain (x+1). This integer (x+1) is equivalent to the number of wafer transfer stopping times. If the cycle time is multiplied by the integer (x+1), a substrate transfer stop period is obtained.

Incidentally, an operator may predict the dummy dispense time based on the stored recipes, and decide the substrate transfer stop period based on the predicted dummy dispense time.

The execution timing of the dummy dispense is controlled by using one of an interval between lots, a time interval between lots and a minimum wafer count. Further, the execution timing of the dummy dispense may be set to a process recipe change timing.

The number of the continuously processed substrates after the previous dummy dispense is counted, and based on the counted number, it can be determined whether or not the next dummy dispense is executed. In this case, the number of the continuously processed substrates can be counted at the processing section or the cassette section.

A continuous processing time of the substrates is counted after the previous dummy dispense, and based on the counted time, it can be determined whether or not the next dummy dispense is executed.

A place of the last substrate of the preceding lot in the processing section is detected, and based on a result of the detection, it can be determined whether or not the next dummy dispense is executed.

Further, in order to detect a step in which the last substrate of the preceding lot and the head substrate of the succeeding lot are present, the substrates actually flowing in the processing section are counted, and based on a result of the counting, it is determined whether or not the next dummy dispense is executed.

In order to prevent adverse effects of mist or vapor of the solution discharged during the dummy dispense, preferably, the dummy dispense is executed while there are no substrates in the coating unit or the developing unit.

BRIEF DESCRIPTION OF THE SEVERAL VIEWS OF THE DRAWING

FIG. 10A is a diagram showing an embodiment of a method of the present invention (dummy dispense is inserted once).

FIG. 10B is a diagram showing another embodiment of a method of the present invention (dummy dispense is inserted twice).

DETAILED DESCRIPTION OF THE INVENTION

Figure 1:
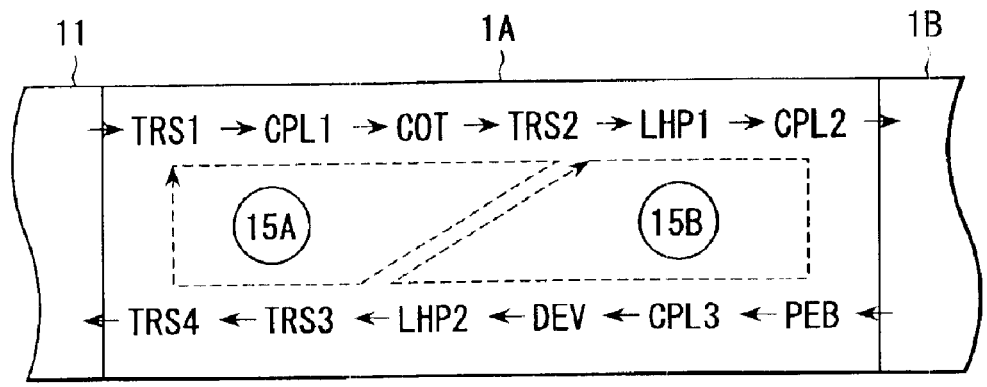
FIG. 1 is a schematic plan view showing a substrate carrying route in a conventional device.
Figure 3:
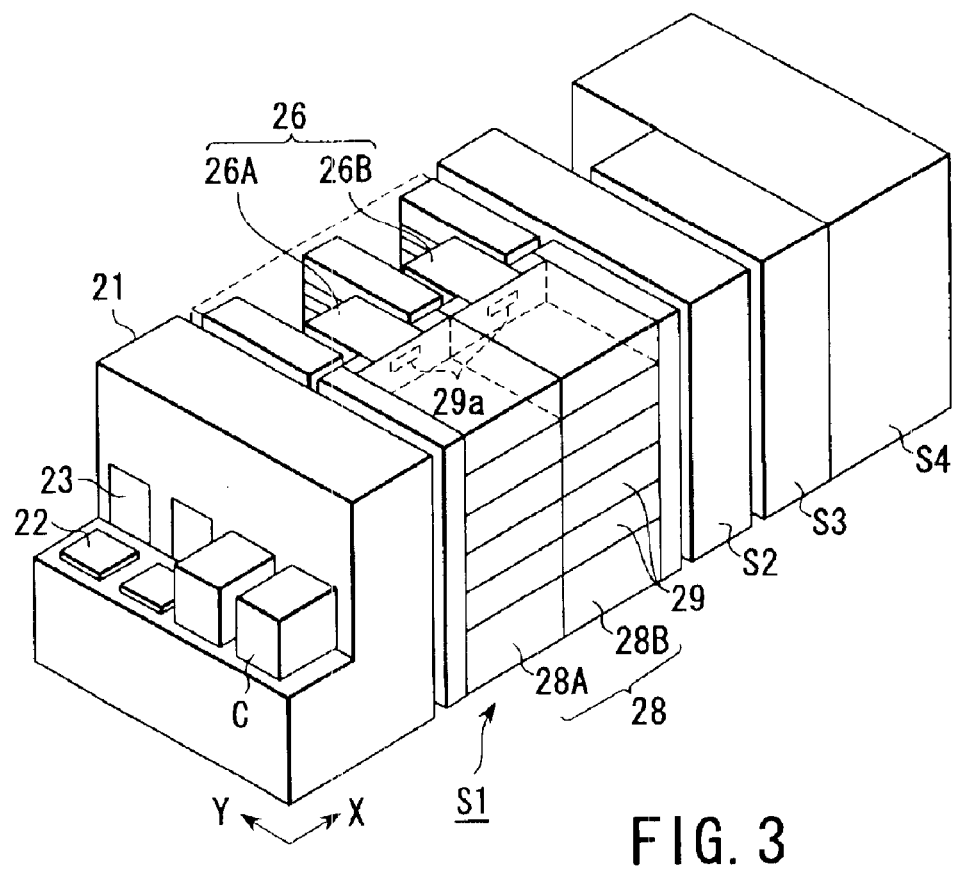
FIG. 3 is a perspective view showing the substrate processing device in outline.
Figure 2:
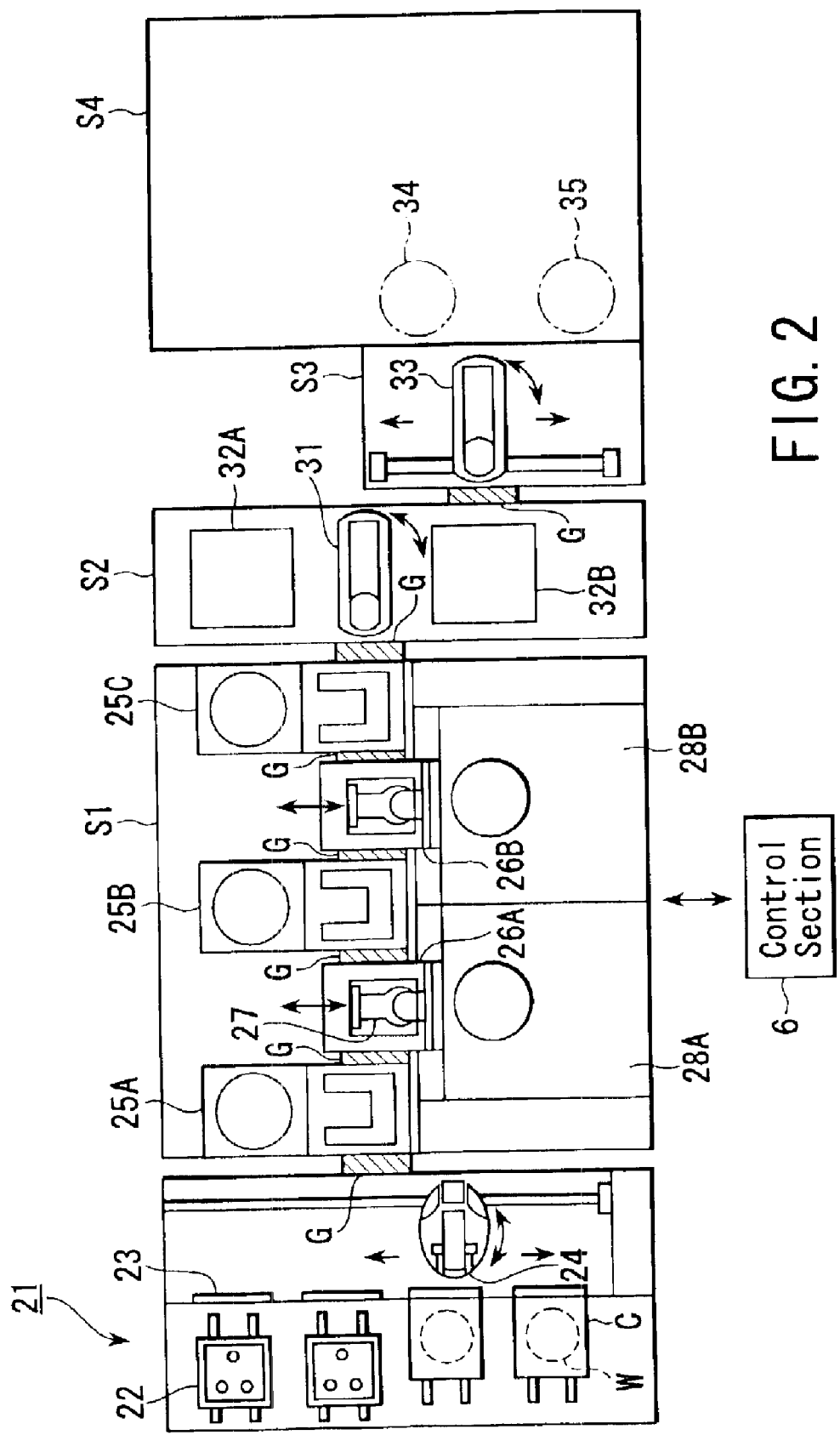
FIG. 2 is a plan view showing a substrate processing device in outline.

First, description will be made in outline of an example of a substrate processing device where a substrate processing method of the present invention is implemented. As shown in FIGS. 2, 3, the substrate processing device comprises a cassette station 21, an auxiliary carrying mechanism 24, two main carrying mechanisms 26A, 26B, a processing section S1, a first interface section S2, a second interface section S3, and a control section 6. The cassette station 21 has a mounting section 22. In the mounting section 22, a maximum of four cassettes C are mounted at equal pitches along a Y axis. The cassette C is a hermetically sealed housing type having a cap to be opened/closed, in which a maximum of thirteen wafers W of, e.g., 12 inches, are housed.

An opening/closing section 23 is disposed on a front wall surface seen from the mounting section 22, and the auxiliary carrying mechanism 24 is disposed to take out the wafer W from the cassette C through the opening/closing section 23. This auxiliary carrying mechanism 24 is constituted so that an arm can be freely moved up and down, left and right, and back and forth and rotated around a vertical axis. Driving thereof is controlled by a controller 40 (see FIG. 6) based on a command from the control section 6.

The processing section S1 surrounded with a casing is connected to a deep side of the cassette station 21. In this processing section S1, sequentially from a front side, three shelf units 25 (25A, 25B, 25C) where a heating/cooling system unit is multistaged, and two main carrying mechanisms 26 (26A, 26B) for transferring the wafer W between later-described solution processing units are alternately arrayed. Each of the main carrying mechanisms 26 (26A, 26B) comprises, for example, two arms 27. It is constituted so that the arm 27 can be freely moved up and down, left and right, and back and forth and rotated around the vertical axis. Driving thereof is controlled by the controller 40 (see FIG. 6) based on a command from the control section 6.

The shelf units 25 (25A, 25B, 25C) and the main carrying mechanisms 26 (26A, 26B) are arrayed in rows back and forth when seen from the cassette station 21 side, and a not-shown opening for wafer carrying is formed in each connection portion G. Thus, in the processing section S1, the wafer W can be freely moved from the shelf unit 25A of one end to the shelf unit 25C of the other end.

The main carrying mechanisms 26 (26A, 26B) are placed in a space surrounded with a partition wall constituted of one surface of the shelf unit 25 (25A, 25B, 25C) side arranged back and forth when seen from the cassette station 21, and a rear constituting, for example, one surface of the solution processing device of a right side and one surface of a left side.

In portions of the main carrying mechanisms 26A, 26B to which the shelf units 25A, 25B, 25C are not connected, e.g., in the aforementioned right side surfaces, solution processing units 28A, 28B where solution processing devices such as a coating device 4A and a developing device 4B are multistaged are disposed. In each of these solution processing units 28A, 28B, as shown in FIG. 3, a plurality of stages (e.g., 5 stages) of processing containers 29 are laminated to house the coating device 4A or the like. On the side face of each of the processing containers 29 in the substrate carrying means side, a carrying port 29a is formed to enable entry of the arm 27 during carrying in/out of the wafer W, and a not-shown shutter is disposed in the carrying port 29a.

Figure 4:
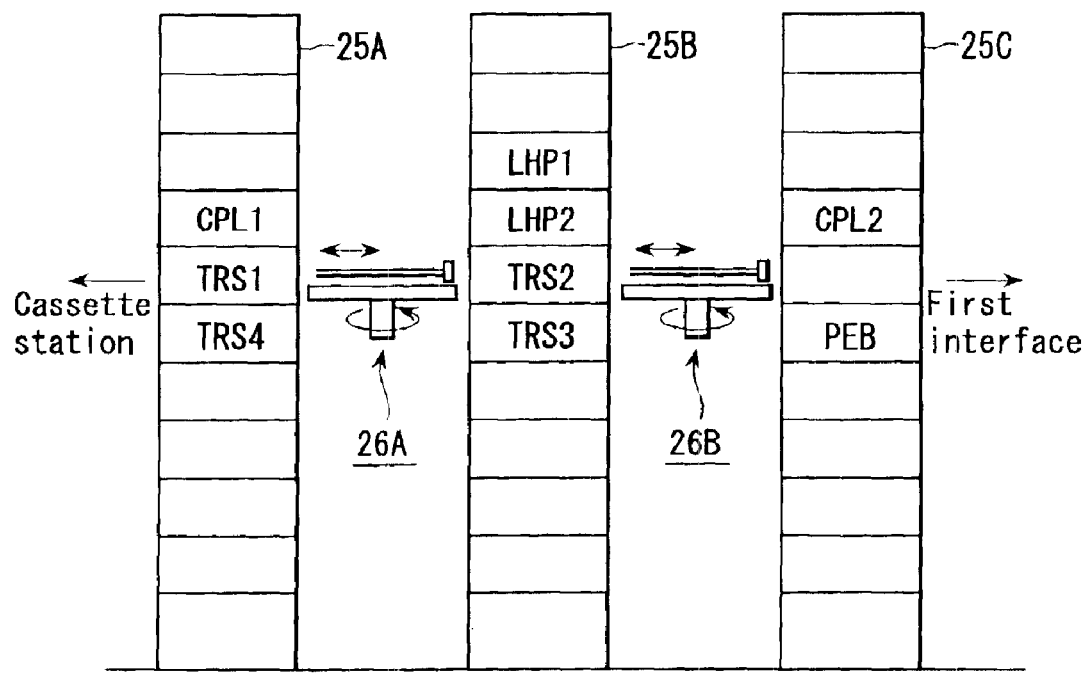
FIG. 4 is a schematic side view showing a shelf unit portion of the substrate processing device.

As shown in FIG. 4, the shelf units 25A, 25B, 25C comprise a plurality of transfer units TRS1, TRS2, TRS3, TRS4, a plurality of heating units LHP1, LHP2, and a plurality of cooling units CPL1, CPL2, CPL3. Each of the transfer units TRS1 to TRS4 comprises a transfer base to transfer the wafer. The heating units LHP1, LHP2 heat the wafer after resist coating or developer solution coating. The cooling units CPL1, CPL2, CPL3 cool the wafer before/after the resist coating or before development. For example, ten stages of heating units (PEB) are allocated up and down. Here, the TRS1, TRS4 are used to transfer the wafer between the cassette station 21 and the processing section S1. The TRS2, TRS3 are used to transfer the wafer between the main carrying mechanisms 26A, 26B.

According to the embodiment, the transfer units TRS1, TRS2, TRS3, TRS4, the heating units LHP1, LHP2, the cooling units CPL1, CPL2, CPL3, the heating units PEB and the heating units are equivalent to "processing units". The transfer units TRS1, TRS4, the heating units PEB, and the auxiliary carrying mechanism 24 are equivalent to "transfer mechanisms". The transfer units TRS1 to TRS4 may be used not only for substrate transfer but also for substrate heating/cooling.

An exposure device S4 is connected to a deep side of the shelf unit 25C in the processing section S1 through the first interface section S2 and the second interface section S3. The first interface section S2 comprises an auxiliary carrying mechanism 31 constituted to be freely moved up and down and rotated around the vertical axis and to transfer the wafer to the CPL2 or the PEB of the shelf unit 25C of the processing section S1 as described later, a shelf unit 32A where an in-buffer cassette for temporarily storing the wafer carried into a peripheral exposure device and the exposure device S4 and an out-buffer cassette for temporarily storing the wafer carried out from the exposure device S4 are arranged at multiple stages, and a shelf unit 32B where a wafer transfer unit and a highly accurate air conditioning unit are arranged at multiple stages.

In the second interface section S3, an auxiliary carrying mechanism 33 is disposed so as to be freely moved roughly horizontally and up and down, and rotated around the vertical axis, whereby the wafer is transferred to the transfer unit and the highly accurate air conditioning unit of the first interface section S1, and an in-stage 34 and an out-stage 35 of the exposure device S4.

Figure 5:
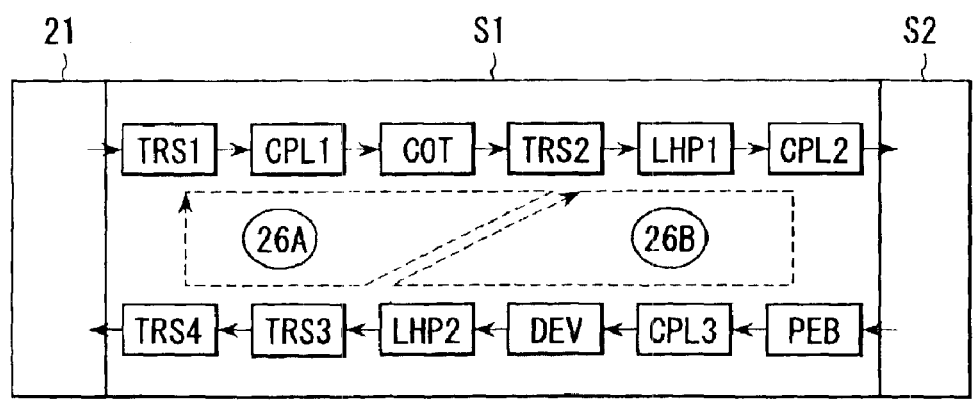
FIG. 5 is a schematic plan view showing a substrate carrying route in a device of the present invention.

Next, movements of the main carrying mechanisms 26A, 26B in the processing section S1 will be described. As shown in FIG. 5, the two main carrying mechanisms 26A, 26B move to carry the wafer W from the cassette station 21 to the first interface section S2 in sequence of the TRS1→the CPL1→the coating unit→the TRS2→the LHP1→the CPL2, and then to carry the wafer from the first interface section S2 to the cassette station 21 in sequence of the PEB→the CPL3→the developing device (DEV)→the LHP2→the TRS3→the TRS4. Between the processing section S1 and the first interface section S2, the wafer W is transferred through he CPL2 and the PEB.

As indicated by a broken line in FIG. 5, one main carrying mechanism 26A carries the wafer W in a sequence of the TRS1→the CPL1→the COT→the TRS2→the TRS3→the TRS4→the TRS1. The other main carrying mechanism 26B carries the wafer W in a sequence of the TRS2→the LHP1→the CPL2→the PEB→the CPL3→the DEV→the LHP2→the TRS3→the TRS2. Thus, as shown in FIG. 4, the TRS1, TRS4 are arranged in the shelf unit 25A, the TRS2, TRS3 are arranged in the shelf unit 25B, the CPL2 and the PEB are arranged in the shelf unit 25C, the CPL1 is arranged in the shelf unit 25A or 25B, and the LHP1, LHP2 are arranged in the shelf unit 25B or 25C.

A flow of the wafer in the device will be described. First, when the cassette C housing the wafer W is carried from the outside into the cassette station 21, the cap of the cassette C is removed together with the opening/closing section 23, and the wafer W is taken out by the auxiliary carrying mechanism 24. Then, the wafer W is transferred from the auxiliary carrying mechanism 24 to the main carrying mechanism 26A through the transfer unit (TRS1) which is one component of the shelf unit 25A. Subsequently, the wafer W is carried in a sequence of the TRS1→the CPL1→the COT→the TRS2→the LHP1→the CPL2 by the main carrying mechanisms 26A, 26B, and the wafer on which the resist solution is coated is sent to the first interface section S2 through the CPL2.

In the first interface section S2, the wafer is carried in a sequence of the in-buffer cassette→the peripheral exposure device→the highly accurate air conditioning unit by the auxiliary carrying mechanism 31, carried to the second interface section S3 through the transfer unit of the shelf unit 32B, and then carried by the auxiliary carrying mechanism 33 of the second interface section S3 to the exposure device S4 through the in-stage 34 of the exposure device S4 to be exposed.

The exposed wafer is carried through the second interface section S3→the first intersection section S2 to the processing section S1 through the PEB of the processing section S1, and then carried in a sequence of the PEB→the CPL3→the DEV→the LHP2→the TRS3→the TRS4.

The first main carrying mechanism 26A carries an. n-th wafer W of the lot to the CPL1 of a next step through the TRS1, then passes through in a sequence of the COT→the TRS2→the TRS3→the TRS4→the TRS1, and returns to the TRS1 (1 cycle) to carry a next (n+1)-th wafer Wn+1 to the CPL1 through the TRS1. During this one cycle, the second main carrying mechanism 26B carries the wafer of the TRS2 to the LHP1 of a next step, and then returns to the TRS2 again after one cycle on a route of the CPL2→the PEB→the CPL3→the DEV→the LHP2→the TRS3→the TRS2 to carry a next wafer to the LHP1 through the TRS2.

Figure 6:
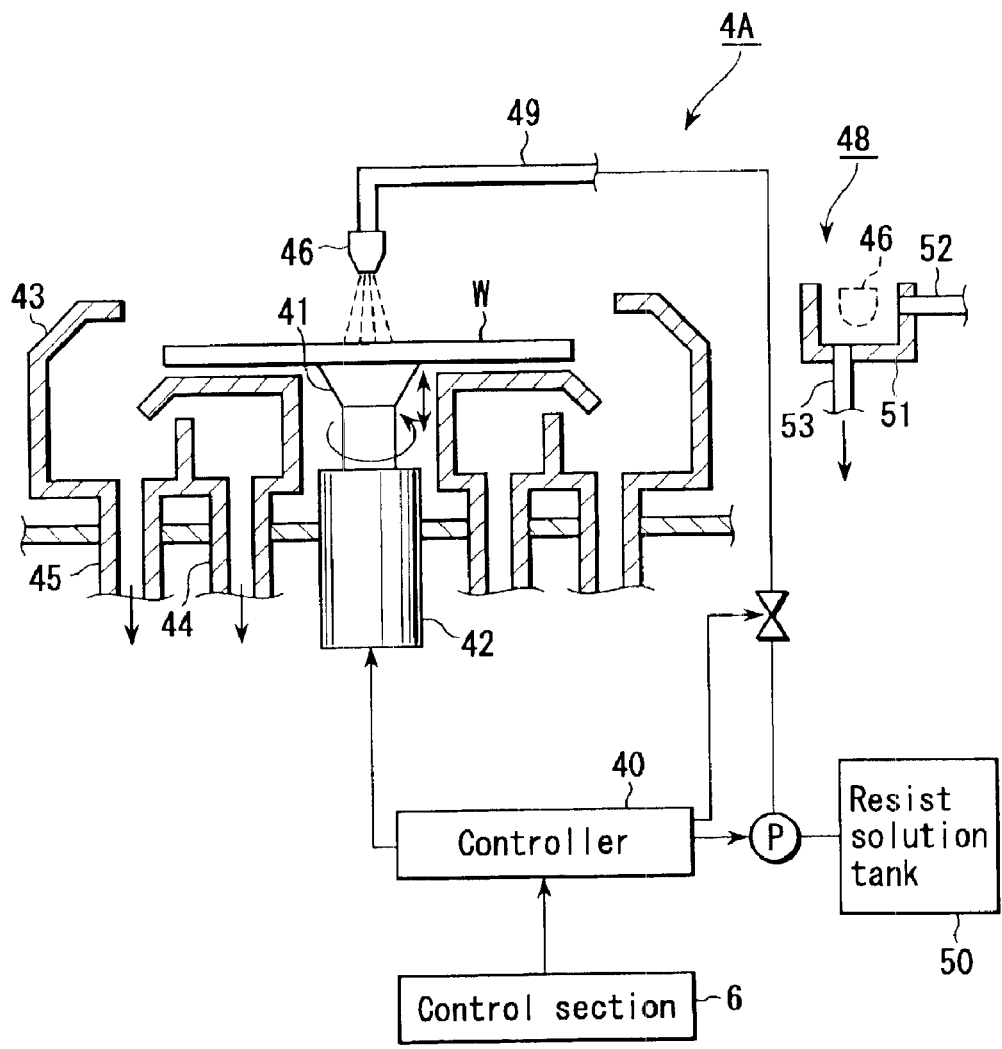
FIG. 6 is a schematic sectional view showing a coating device portion of the substrate processing device.

Now, the coating device 4A shown in FIG. 6 will be described. A spin chuck 41 can be rotated roughly around the vertical axis by a driving section 42 including a motor and an elevation section, and moved up and down. Around the spin chuck 41, a solution receiving cup 43 is disposed to cover a portion from the wafer W over the spin chuck 41, in which a recess is formed all around the periphery of a lower side. An exhaust pipe 44 and a drain pipe 45 are connected to a bottom surface of the solution receiving cup 43.

A resist solution supply nozzle 46 is disposed in an upper side of the solution receiving cup 43. This supply nozzle 46 is moved between a part above a center of the wafer W and a standby section 48 outside the solution receiving cup 43 by a not-shown moving mechanism. The supply nozzle 46 is communicated and connected through a supply route 49 having a pump P and a valve V set up to feed the resist solution into the nozzle 46 by pressure to a resist solution tank 50 which is a resist solution supply source.

In the standby section 48, a cleaning tank 51 is disposed to store thinner as a cleaning solution. This cleaning tank 51 comprises a cleaning solution supply pipe 52 for supplying the cleaning solution into the cleaning tank 51, and a discharge pipe 53 for discharging the cleaning solution or the like from the cleaning tank.

In the standby section 48, during dummy dispense, the resist solution is discharged from the supply nozzle 46 into the cleaning tank 51, and the discharged resist solution is discharged from the discharge pipe 53. While the supply nozzle 46 is on standby, the nozzle 46 is dipped in the cleaning tank 51, to be cleaned by the cleaning solution.

The main carrying mechanism 26A carries the wafer W into such a coating device 4A, and the wafer W is transferred to the spin chuck 41. Then, a resist is spin-coated on the wafer W. At this time, operations of the driving section 42, the valve V and the pump P are controlled by the controller 40. Conditions including timing of a start or stop of the operation of the driving section 42, opening/closing of the valve V, and the operation of the pump P, a rotational speed of the spin chuck 41, the amount of the discharged resist solution etc. are set by the later-described control section 6, and a command is issued from the control section 6 to the controller 40A.

Figure 7:
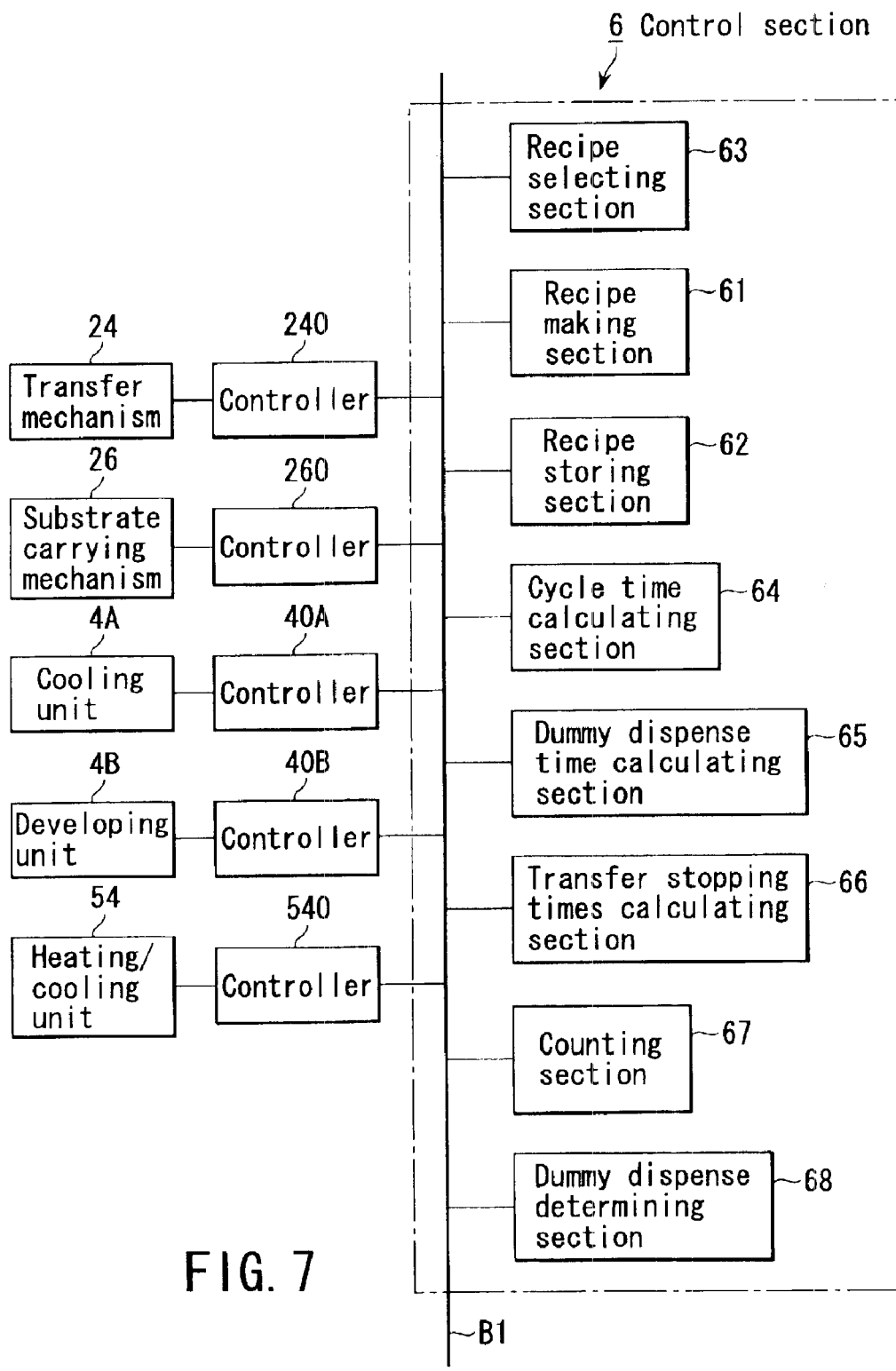
FIG. 7 is a control block diagram showing a control section and a controller of each section of the substrate processing device.

Next, the control section 6 will be described by referring to FIG. 7.

The control section 6 makes and manages a recipe for each processing unit, and controls each processing unit in accordance with the recipe. The control section 6 comprises a recipe making section 61, a recipe storing section 62, a recipe selecting section 63, a cycle time calculating section 64, a dummy dispense time calculating section 65, a transfer stopping times calculating section 66, a counting section 67, and a dummy dispense determining section 68. These sections 61 to 68 are interconnected through a system bus B1.

Further, the control section 6 is connected to controllers 260, 240, 40A, 40B, 540 in order to send control signals to the main carrying mechanisms 26A, 26B, the auxiliary carrying mechanism 24, the coating device 4A, the developing device 4B, and a heating/cooling system unit 54 such as the CPL, the LHP or the PEB disposed in each of the shelf units 25A to 25C.

In the recipe making section 61, a process recipe can be entered, which combines processing conditions, such as kind of resist and developer solution, a heating temperature and time, a cooling temperature and time, a coating time of a resist solution, a developing time, timing of the dummy dispense, and the number of wafers per lot. This recipe making section 61 includes a plurality of edit screens shown in FIGS. 13 and 14. Each recipe made by the recipe making section 61 is stored in the recipe storing section 62.

Figure 8:
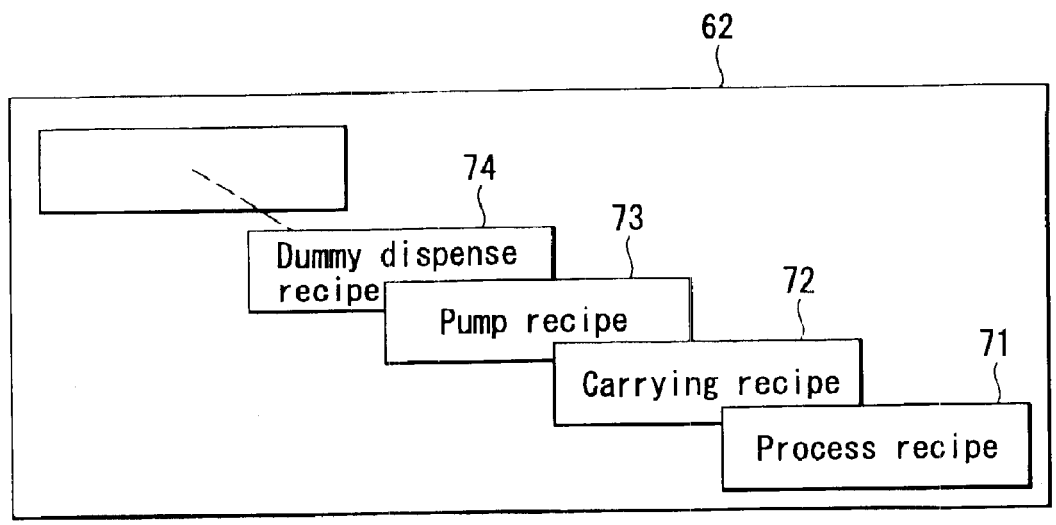
FIG. 8 is a conceptual view showing a recipe storage section of the control section.

As shown in FIG. 8, the recipe storing section 62 stores a process recipe 71, a wafer carrying recipe 72, a pump recipe 73, a dummy dispense recipe 74 etc.

In the recipe selecting section 63, based on data which an operator enters on an operation screen in accordance with a target process, selection is made from the process recipe 71, the carrying recipe 72, the pump recipe 73 and the dummy dispense recipe 74.

The cycle time calculating section 64 has a function of calculating a cycle time of the main carrying mechanism 26A for carrying the wafer to the coating unit COT according to the embodiment. Here, the "cycle time" means a time from transfer of the n-th wafer in the cassette C of the cassette station 21 to the main carrying mechanism 26A to transfer of a next (n+1)-th wafer to the main carrying mechanism 26A. Specifically, it means a time from a point when the main carrying mechanism 26A receives the n-th wafer transferred from the cassette C to the TRS1 of the processing section S1 by the auxiliary carrying mechanism 24 to a point when the main carrying mechanism 26A moves along a predetermined route in the processing section S1 to receive the (n+1)-th wafer transferred again from the cassette station 21 to the TRS1. This cycle time is calculated based on the process recipe 71 and the carrying recipe 72 selected by the recipe selecting section 63. The cycle time is set to, for example, 30 seconds.

The dummy dispense time calculating section 65f has a function of calculating a dummy dispense time in the coating device. The dummy dispense time is calculated based on the pump recipe 73 and the dummy dispense recipe 74 selected by the recipe selecting section 63. The dummy dispense time is set to, for example, 20 seconds (or 40 seconds).

The wafer transfer stopping times calculating section 66 has a function of calculating, in the case of carrying out the dummy dispense between a preceding lot and a succeeding lot in the solution processing unit, the number of times of stopping the transfer of a first wafer B01 of the succeeding lot to the substrate carrying means after a last wafer 25A of the preceding lot of the cassette station 21 is transferred to the main carrying mechanism 26A.

According to the embodiment, the "wafer transfer stop period (number of cycles)" means a period of stopping the transfer of the wafer from the cassette station 21 to the TRS1 (number of cycles). This period (number of cycles) is calculated based on a cycle time and a dummy dispense time given by predetermined recipes. For example, if the cycle time is A seconds and the dummy dispense time is B seconds, first, an integer x (including 0), which satisfies a relation of an inequality A×x<B, is obtained. Then, 1 is added to the integer x to obtain (x+1). This (x+1) becomes the number of times of stopping wafer transfer, i.e., a wafer transfer stop period where the main carrying mechanism 26A carries no wafers.

Explanation is made by showing specific numerical values. If the cycle time A is 30 seconds and the dummy dispense time B is 20 seconds, since the cycle time A is longer than the dummy dispense time B, the relation of the inequality A×x<B is not established. Thus, x=0 is set, and the number of times of stopping wafer transfer (x+1) becomes 1. If the number of times of stopping wafer transfer is 1, a wafer carrying recipe of the main carrying mechanism 26A becomes similar to that shown in FIG. 10A. In the drawing, the dummy dispense is denoted by a reference code DD. If the cycle time A and the dummy dispense time B are equal (A=B), since the relation of the inequality Axx<B is not established, the number of times of stopping wafer transfer becomes 1.

If the cycle time A is 30 seconds and the dummy dispense time B is 40 seconds, since the cycle time A is shorter than the dummy dispense time B, the relation of the inequality Axx<B is established. Thus, x=1 is set, and the number of times of stopping wafer transfer (x+1) becomes 2. If the number of times of stopping wafer transfer is 2, a wafer carrying recipe of the main carrying mechanism 26A becomes similar to that shown in FIG. 10B.

The counting section 67 has a function of counting the number of wafers to be processed in the processing section S1. For example, when wafers are transferred from the auxiliary carrying mechanism 24 of the cassette station 21 to the TRS1 of the processing section S1, the number thereof is counted by the counting section 67. Further, the dummy dispense determining section 68 has a function of determining whether or not the dummy dispense is carried out based on, for example, the number of wafers counted by the counting section 67.

Next, description will be made of resist pattern formation carried out by using the substrate processing device of the embodiment.

First, before a resist pattern is formed, the operator selects the process recipe 71, the carrying recipe 72, the pump recipe 73, and the dummy dispense recipe 74 of a film to be formed by the recipe selecting section 63. Here, for example, if a target recipe is execution of the dummy dispense between the preceding lot A and the succeeding lot B by the coating device 4A, at the cycle time calculating section 64, the cycle time of the main carrying mechanism 26A for carrying a wafer to the coating device 4A is calculated based on the process recipe 71 and the carrying recipe 72 of the preceding lot A. Further, at the dummy dispense time calculating section 65, the dummy dispense time B of the coating device 4A is calculated based on the pump recipe 73 and the dummy dispense recipe 74 of the preceding lot A.

Then, at the wafer transfer stopping times calculating section 66, based on the cycle time A and the dummy dispense time B of the main carrying mechanism 26A, the number of times of stopping wafer transfer from the cassette station 21 to the TRS1 of the processing section S1 (x+1) and a wafer transfer stop period (sec.) are calculated. For example, a command is outputted to the controller 240 of the transfer arm 24 of the cassette station 21 to stop an operation of taking out wafers from the cassette C by the calculated number of stopping times after the last wafer A25 of the preceding lot A is transferred to the TRS1, and to take out the first wafer B01 of the succeeding lot B and transfer it to the TRS1.

Then, the control section 6 outputs a start command of the preceding lot A to each section. Thus, for example, while the number of wafers is counted by the counting section 67 when the wafers are transferred to the TRS1 of the processing section S1 by the auxiliary carrying mechanism 24 of the cassette station 21, the wafers are carried by the main carrying mechanisms 26A, 26B to be subjected to a predetermined process, and it is determined whether or not the dummy dispense is carried out based on the counted number. According to the embodiment, when the preset number is counted, for example, when the last wafer A25 of the preceding lot A is counted, determination is made as to whether the dummy dispense is executed. If nonexecution of the dummy dispense is determined, the wafer is carried along the aforementioned route by the main carrying mechanisms 26A, 26B to be subjected to a predetermined process.

If execution of the dummy dispense is determined, the control section 6 outputs a command to the coating device 4A, the pump P and the valve V. When the wafer A25 is taken out from the coating device 4A, the valve V is opened and the pump P is operated to execute the dummy dispense. When the last wafer A25 of the preceding lot A is counted, based on the command from the control section 6, the auxiliary carrying mechanism 24 of the cassette station 21 stops taking out the calculated number of wafers, whereby the wafer transfer operation to the TRS1 of the processing section S1 is stopped for a predetermined period.

The first wafer B01 of the succeeding lot B is carried to the TRS1 by the auxiliary carrying mechanism 24, and then carried into the processing section S1 by the main carrying mechanisms 26A, 26B. When the dummy dispense is executed and the taking-out of the first wafer B01 of the succeeding lot B by the auxiliary carrying mechanism 24 of the cassette station 21 is stopped, the counted number is cleared. When the first wafer B01 of the succeeding lot B is carried to the TRS1 of the processing section S1, next counting is started.

Between the last wafer A25 of the preceding lot A and the first wafer B01 of the succeeding lot B, wafer transfer from the cassette station 21 to the TRS1 of the processing section S1 by the auxiliary carrying mechanism 24 is not carried out for a predetermined number of times. During this period, the dummy dispense is executed.

Figure 9:
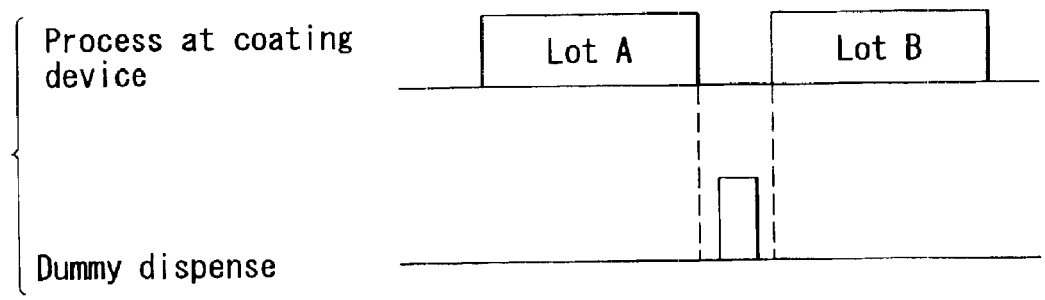
FIG. 9 is a timing chart schematically showing execution timing of dummy dispense.

As shown in FIG. 9, a period of no wafer carrying is set between the process of the preceding lot A and the process of the succeeding lot B in the coating device 4A and, during this period, the dummy dispense is executed. Accordingly, no substrate congestion occurs in the processing section until the dummy dispense is finished in the coating device 4A. That is, a standby state of the substrates in the heating unit disappears to enable prevention of overbaking of the resist film.

For example, if the cycle time is 30 seconds and the dummy dispense time is 20 seconds, the number of times of stopping wafer transfer (x+1) becomes 1. In this case, as shown in FIG. 10A, an empty time of not carrying one wafer is set between the wafer A25 and the wafer B01. When resist coating on the wafer A25 is finished in the coating device 4A and the wafer A25 is carried to the TRS2 which is a next step of the coating device 4A, the wafer B01 is carried to the CPL1 which is a previous step of the coating device 4A. In this state, the dummy dispense is executed in the coating device 4A. However, since the dummy dispense time is 20 seconds and the cycle time is 30 seconds, the wafer B01 of the CPL1 is carried to the coating device 4A by the main carrying mechanism 26A after the end of the dummy dispense. Accordingly, since the wafer B01 is immediately transferred to the coating device 4A without being set on standby, during the dummy dispense, the wafer carrying by the substrate carrying means is smoothly executed, without being stopped, to enable improvement of throughput.

If the cycle time is 30 seconds and the dummy dispense time is 40 seconds, the number of wafer transfer stopping times (x+1) becomes 2. In this case, as shown in FIG. 10B, an empty carrying cycle time of not carrying two wafers is set between the wafer A25 and the wafer B01.

Depending on the kind of target film, the next step of the coating device for executing the dummy dispense may be a heating step for heating the wafer. In the case of carrying wafers by the conventional method, wafer taking-out from the heating device must be set on standby until the dummy dispense is finished. Thus, in the conventional method, the wafer taking-out from the heating device is delayed by an amount equal to the dummy dispense time, which overbakes the resist film, which may make the resist film too thin, leading to a change in pattern line width.

However, according to the method of the present invention, when the dummy dispense is executed in the coating device 4A, since the transfer of the wafer W from the auxiliary carrying mechanism 24 of the cassette station 21 to the main carrying mechanism 26A is stopped, the resist film is not overbaked by the heating device.

Figure 11A:
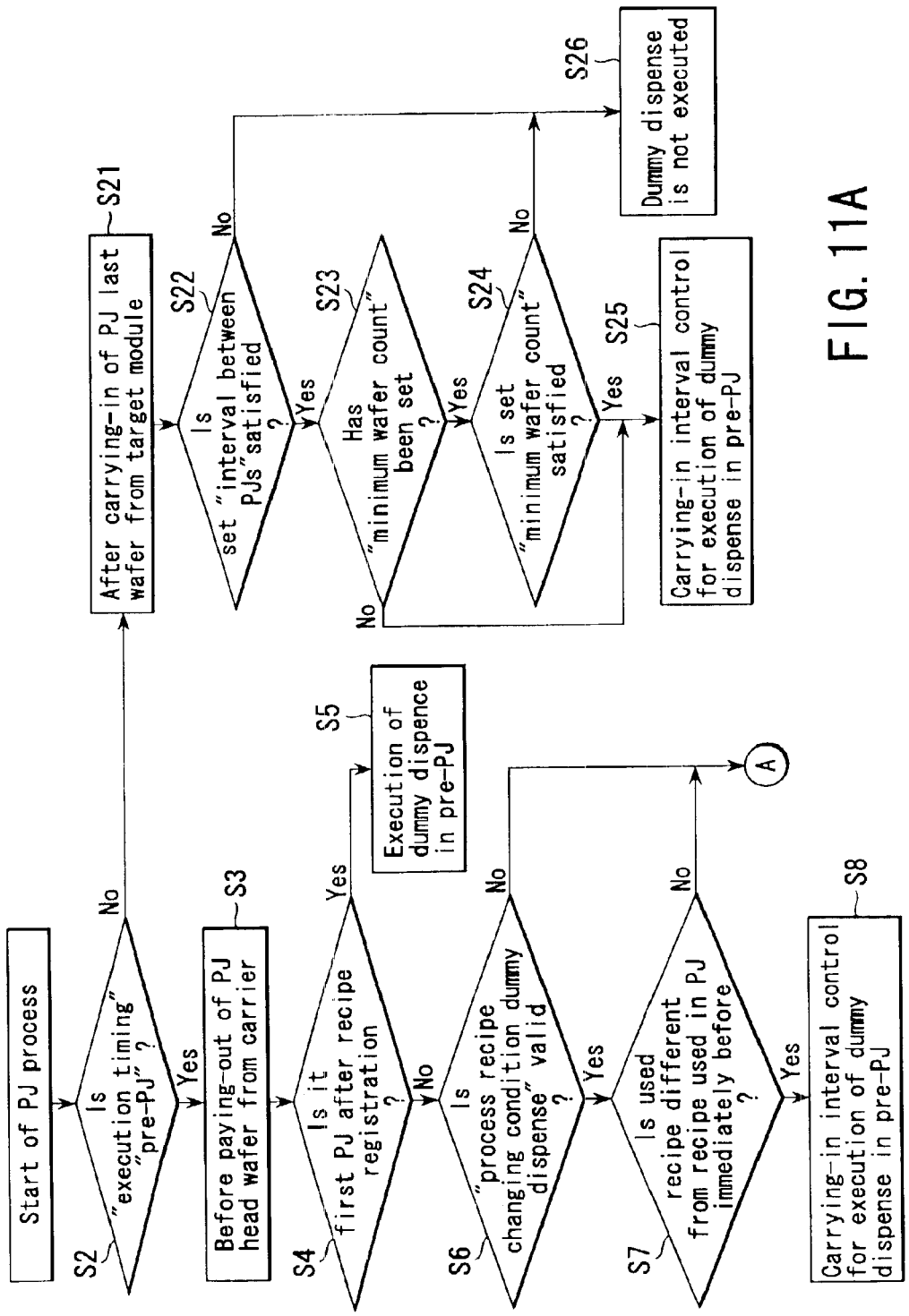
FIGS. 11A and 11B are flowcharts of control processed by software in a computer before the computer issues a dummy dispense execution command to the controller of each section.
Figure 11B:
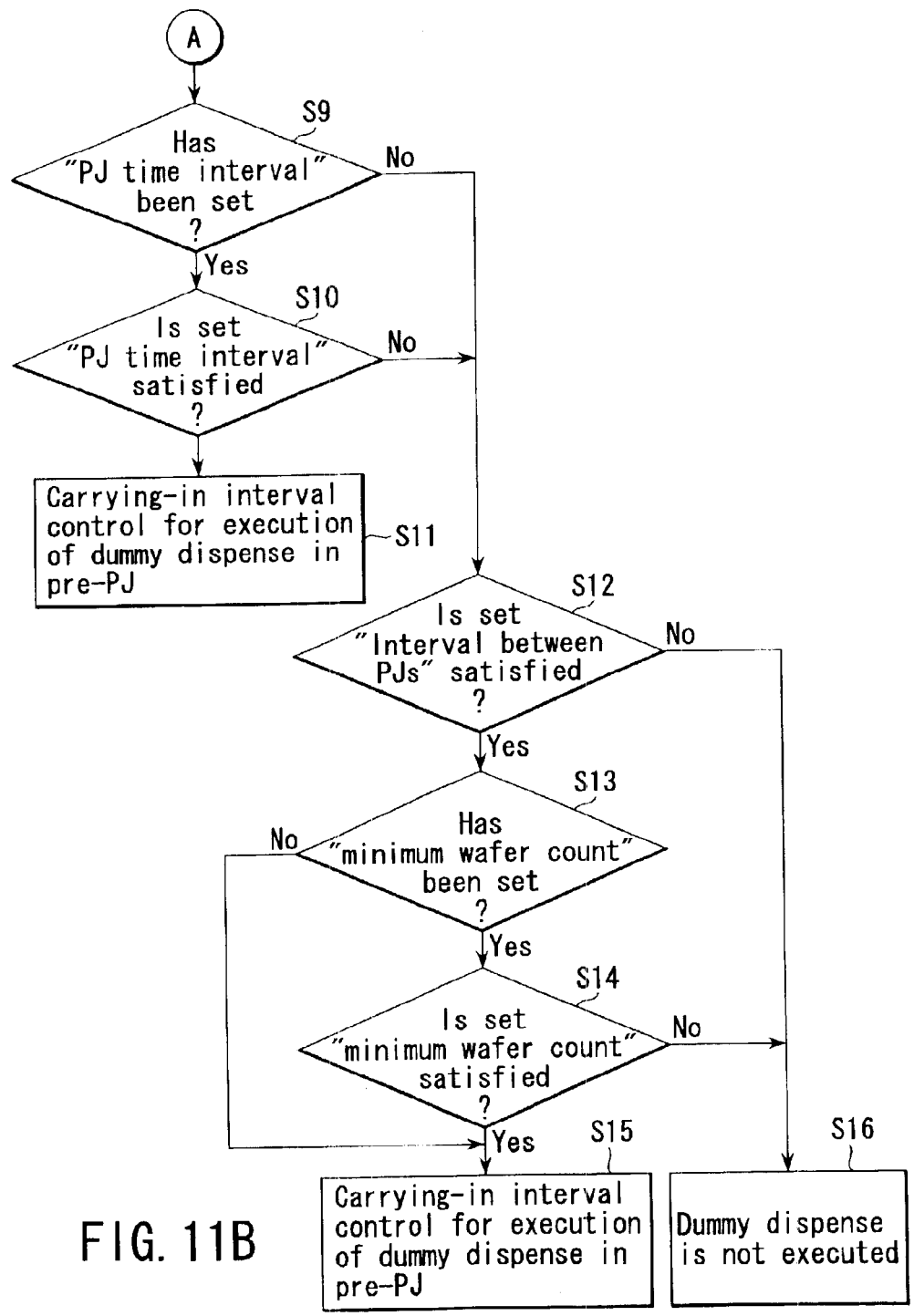

Next, description will be made of a flow of control processed by software in the control section 6 by referring to FIGS. 11A and 11B.

First, "recipe specified resists" are registered as control items. In the case of sequence setting of the control items "recipe specified resists", target resists are selected by "target resist" selecting buttons, and an operation sequence is set for all the displayed resists. Settable items (operating conditions) are as follows.

1) PJ interval
2) Minimum wafer count
3) Execution timing (pre-PJ/post-PJ)
4) Time interval between PJs
5) Process recipe changing conditions (set by system parameter: valid/invalid)

In the case of registering the recipe specified resists, the PJ interval of the item 1) must always be set. The PJ time interval of the item 4) can be set only when the execution timing is pre-PJ.

Upon completion of the registration of the control items "recipe specified resists", PJ process programming is started in the control section 6 (step S1). In the PJ process programming, first, it is determined whether or not "execution timing" is pre-PJ (step S2). If the determination of step S2 is YES, before paying-out of a PJ head wafer from a carrier (cassette) (step S3) and after the recipe registration, determination is made as to whether it is a first PJ or not (step S4). If the determination of step S2 is NO, the process proceeds to later-described steps S21 to S26.

If the determination of step S4 is YES, the dummy dispense is executed in pre-PJ (step S5). If the determination of step S4 is NO, it is determined whether or not "process recipe changing condition dummy dispense" is valid (step S6).

Further, it is determined whether or not a used recipe is different from a PJ used immediately before (step S7). If the determination of step S7 is YES, the wafer carrying-in interval is controlled in order to execute the dummy dispense in pre-PJ (step S8). If the determination of step S7 is NO, it is further determined whether or not a "time interval between PJs" has been set (step S9).

If the determination of step S9 is YES, it is determined whether or not the set "time interval between PJs" is satisfied (step S10). If the determination of step S10 is YES, control signals are sent to the main carrying mechanisms 26A, 26B to control operations of both, whereby the wafer carrying-in interval is adjusted to enable execution of the dummy dispense in pre-PJ (step S11).

If the determination of steps S9, S10 are NO, it is determined whether or not the set "PJ interval" is satisfied (step S12). If the determination of step S12 is YES, it is determined whether or not a "minimum wafer count" has been set (step S13).

If the determination of step S13 is YES, it is determined whether or not the set "minimum wafer count" is satisfied (step S14).

If the determination of step S14 is YES, control signals are sent to the main carrying mechanisms 26A, 26B to control operations of both, whereby the wafer carrying-in interval is adjusted to enable execution of the dummy dispense in pre-PJ (step S15). If the determinations of steps S12, S14 are NO, the dummy dispense is not executed (step S16).

If the determination of step S2 is NO, after carrying-in of a PJ last wafer from a target module (step S21), it is determined whether or not the set "PJ interval" is satisfied (step S22). If the determination of step S22 is YES, it is determined whether or not a "minimum wafer count" has been set (s23). Then, if the determination of step S23 is YES, it is determined whether or not the set "minimum wafer count" is satisfied (step S24). If the determination of step S24 is YES, control signals are sent to the main carrying mechanisms 26A, 26B to control operations of both, whereby the wafer carrying-in interval by the carrying mechanism 26A, 26B is adjusted to execute the dummy dispense in pre-PJ (step S25). If the determinations of steps S22, S24 are No, the dummy dispense is not executed (step S26).

Figure 12:
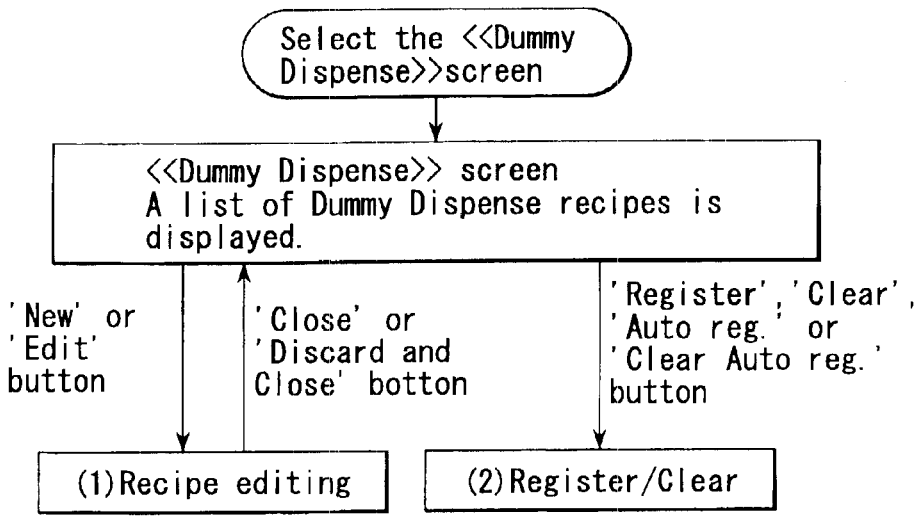
FIG. 12 is a block conceptual diagram explaining a main function concerning a dummy dispense recipe.

As shown in FIG. 12, as functions concerning dummy dispense recipes, there are two functions, i.e., (1) recipe editing and (2) register/clear. First, a dummy dispense recipe screen is selected on an input operation panel to display a "list of recipes". In the case of recipe editing, a new or edit button is clicked on the "recipe list display" screen to display a recipe editing screen. After a predetermined editing operation, a close button or a discard and close button is clicked to finish the screen. In the case of registering/ clearing, a register, clear, automatic register or automatic registration clear button is clicked on the "recipe list display" screen.

Next, the dummy dispense recipes will be described briefly.

The operator can set "dummy dispense operation conditions", "an operation sequence" and "a pump recipe" in control items of modules in one dummy dispense recipe. For the modules and the control items, a necessary amount is automatically set in a recipe during new recipe making. The operator cannot add/delete modules or control items. For the recipe specified resists (or recipe specified developing solutions), an operation sequence and a pump recipe can be set for each resist (or developer solution).

Valid control items in each module are set based the following criteria (i) (ii) (iii) as shown in Table 1.

(i) All dispenses which are "YES" in dispense constituting parameters.

(ii) If one of a plurality of resists 1 to N (or nozzle 1 to N) is in (i), a "recipe specified resist (or recipe specified developer solution)" is added.

(iii) If a plurality of dummy dispense condition setting function options are valid, for the resists (or developer solutions), items named "resist priority 1", "resist priority 2"... "resist priority N" (N is optionally decided) are added.

If the control item is a recipe specified resist (or recipe specified developer solution), as settable operating conditions, there are PJ conditions (process job condition= lot condition), a minimum wafer count, execution timing, and a time interval between PJs. If the plurality of dummy dispense condition setting function options are valid and the control item is a resist priority N, as settable operating conditions, there are a time interval, and dispense during process/not. Further, if the control is other than the above, as shown in Table 1, as settable operating conditions, there are a time interval, a processed wafer count, and dispense during process/not. In the case of the recipe specified resist (or recipe specified developer solution), an operation sequence and a pump recipe can be set for each resist.

TABLE 1

| Control item | Settable operating condition |
| --- | --- |
| Recipe specified resist | PJ condition, Minimum wafer count, Execution Timing, Time interval between PJs |
| Recipe specified developer solution | |
| Resist priority N (*) | Time interval, Dispense during process/Not |
| Other than those above | Time interval, Processed wafer count, Dispense during process/Not |

Next, brief description will be made of screen constitutions which function as the recipe making section 61, the recipe storing section 62 and the recipe selecting section 63 of the control section.

The dummy dispense recipe list screen (not shown) functions as the recipe storing section 62, where a number of selecting buttons such as edit, new, register, clear, automatic register, automatic registration clear, delete, and close are displayed. By selecting the "edit" button on the list screen, a "dummy dispense recipe edit screen" shown in FIG. 13 is displayed on the input operation panel.

The dummy dispense recipe editing screen functions as the recipe making section 61, and it displays a select module display section (1), a recipe specified resist list (2), a select module selecting button (3), a device constitutional view selecting button (4), a PJ interval selecting button (5), a time interval selecting button (6), a processed wafer count selecting button (7), a PJ interval selecting button (8), a selecting button not using minimum wafer count (9), an execution timing PJ head selecting button (10), a PJ time interval (30 sec.) selecting button (11), a sequence setting button (12), a closing button (13), a discarding and closing button (14), a saving button (15), a header information button (6), a copying button (17), a valid/invalid button (18), an invalid item display button (19), and other buttons.

Figure 13:
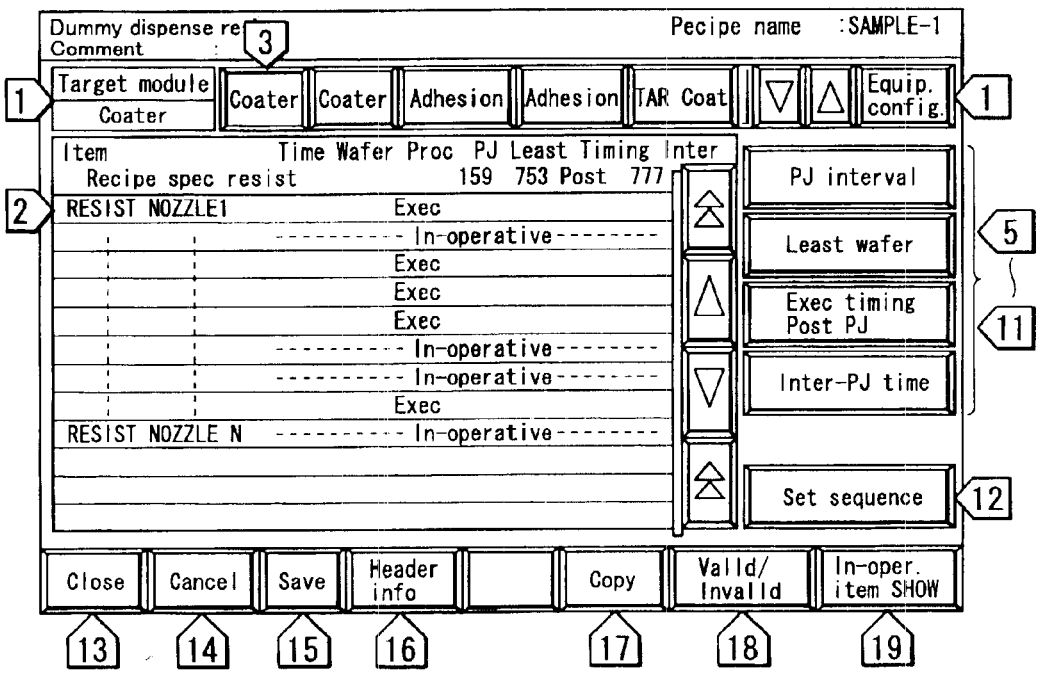
FIG. 13 is a schematic view showing an example of an edit screen of the dummy dispense recipe.

The display sections (1) and (2) in FIG. 13 are for easier understanding of the screen by the operator, and these displays cannot be freely added/deleted by the operator. The button (3) is used to switch a select module displayed in the display section (1). When the screen button (4) is selected, the screen is switched to the device constitutional view. The screen of the device constitutional view (not shown) functions as the recipe making section 61, and it is used when the operator switches the select module.

A group of buttons (5) to (12) of FIG. 13 is used to edit dummy dispense operating conditions. Among these, the group of the buttons (5) to (7) and the group of the buttons (8) to (11) are selectively switched to be displayed on the screen. The former is displayed on the screen when a cursor is set on a control item other than the recipe specified resist, while the latter is displayed on the screen when the cursor is set on the recipe specified resist (or recipe specified developer solution).

When these buttons (5) to (12) are selected, functions indicated by Nos. 1 to 8 in Table 2 are displayed on the screen. For example, if the button (12) is selected, a dummy dispense operation sequence setting screen shown in FIG. 14 appears. On this screen, by switching deletion/insertion and validity/invalidity of steps, each dummy dispense time (sec.) can be set for each resist system. A dummy dispense system number is displayed in No. 1 of the screen, the dummy dispense time (sec.) is displayed in No. 3, a dummy dispense system number is displayed in No. 4, and a dummy dispense system number, a dummy dispense name, a pump recipe name are displayed together in No. 5.

Figure 14:
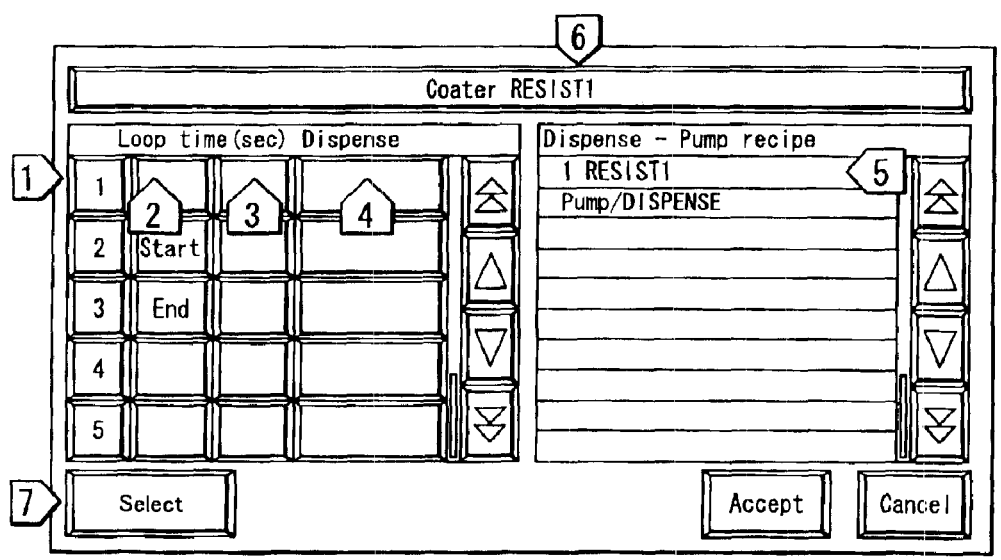
FIG. 14 is a schematic view showing an example of a screen of setting a dummy dispense operation sequence.

For example, when the No. 4 function button of the screen shown in FIG. 14 is selected, a dummy dispense selection screen (not shown) appears. This dummy dispense selection screen functions as the recipe selecting section 63, and it is used to select and set a resist nozzle and a solvent nozzle.

When the No. 5 function button of the dummy dispense operation sequence setting screen is selected, a pump recipe selection screen (not shown) appears. This pump recipe selection screen functions as the recipe selecting section 63, and it is used to select and set a dummy dispense amount and a pump.

TABLE 2

| No. | Function |
| --- | --- |
| 1 | Sets Time interval condition for the selected control item |
| 2 | Sets Processed wafer count condition for the selected control item |
| 3 | Sets Dispense during process for the selected control item (Exec/Not) |
| 4 | Sets PJ count for the selected control item |
| 5 | Sets Minimum wafer count for the selected control item |
| 6 | Sets Execution timing for the selected control item (Not specified/Pre-PJ/Post-PJ) |
| 7 | Sets Time interval between PJs for the selected control item |
| 8 | Displays Executing sequence set screen |

A Group of buttons (13) to (19) in FIG. 13 are function buttons. When these function buttons (13) to (19) are selected, functions indicated by Nos. 1 to 7 in Table 3 appear on the screen. For example, if the button (17) is selected, a copying screen (not shown) is displayed. The copying screen functions as the recipe making section 61, where a module having a control item similar to that at a copying origin is displayed as a choice to be copied. Thus, the item similar to the control item at the copying origin can be duplicated as the control item to be copied.

TABLE 3

| No. | Function |
| --- | --- |
| 1 | Saves the recipe and closes the edit screen |
| 2 | Closes the edit screen without saving the recipe |
| 3 | Saves the recipe |
| 4 | Displays the header information screen that includes comments. |
| 5 | Displays the copy screen |
| 6 | Changes the validity of the selected control item |
| 7 | Changes the display/nondisplay of |

TABLE 3-continued

| No. | Function |
|---|---|
| | invalid items. Nondisplay does not show the item that is "Not use". |

An option screen (not shown) is used to set a plurality of dummy dispense conditions for one resist. For example, for each specified resist, "a resist name", "a dummy dispense time interval", and "possibility of execution in process" are displayed. A dummy dispense operation sequence setting screen (not shown) is called from the option screen to set multi-dummy dispense conditions.

As described above, according to the method of the present invention, when it is determined that the dummy dispense is executed in the coating device 4A, or execution of the dummy dispense is predicted, the transfer of the first wafer B01 of the succeeding lot from the cassette station 21 to the TRS1 of the processing section S1 is stopped to set a predetermined time interval for the dummy dispense between the preceding lot and the succeeding lot.

Determination as to whether or not the dummy dispense is executed may be made by counting the number of processed wafers based on the stored recipes including the prediction of the operator, or by counting a processing time.

The control section 6 may detect a step in which the last wafer A25 of the preceding lot is present, and it may be determined whether or not the dummy dispense is executed based on the detection result.

Further, recognition of the last wafer A25 of the preceding lot and the head wafer B01 of the succeeding lot may be made by directly counting the number of wafers. A step in which the wafer is present may be checked by the control section 6. Incidentally, a wafer counting place is not limited to the TRS1 of the processing section S1, and it may be the cassette C of the cassette station 21.

Here, the timing for the dummy dispense executed in the solution processing device is at processing of the set number of lots, at the processing recipe change timing, when a time from the succeeding lot to a start of the succeeding lot is a predetermined interval or more, at each set time, and when the set number (e.g., 100) is processed.

A target of the dummy dispense is not limited to the coating device 4A, and the developing device 4B and an adhesion unit are included. In the case of executing the dummy dispense in the developing device 4B, the auxiliary carrying mechanism 31 of the first interface section S2 is equivalent to the transfer mechanism of the present invention, the out-buffer cassette of the first interface section S2 is equivalent to the cassette of the invention, and the PEB of the processing section S1 is equivalent to the transfer section of the invention.

In the case of the dummy dispense executed at a plurality of units for carrying by common substrate carrying means, a longer time is set for the dummy dispense, and a wafer transfer stop period (number of empty carrying cycle times) is decided based on this dummy dispense time and the cycle time of the main carrying mechanisms.

The operator may directly enter the cycle time and the dummy dispense time to the recipe making section 61. The operator may predict the dummy dispense time of the solution processing device to decide a transfer stop period of the first substrate of the succeeding lot to the main carrying mechanisms.

Further, the main carrying mechanisms may directly take out the wafer from the cassette. In this case, during the dummy dispense, the operations of the main carrying mechanisms are controlled to stop the taking-out of the first wafer of the succeeding lot. Additionally, the number of main carrying mechanisms is not limited to two, but it may be three or more, or even one.

According to the present invention, in the case of executing the dummy dispense in the solution processing device, since the transfer of the substrates from the cassette section to the processing section is stopped for the predetermined period, no substrates stay in the processing section, which enables prevention of overbaking of the resist film by, for example, the heating device.

What is claimed is:

1. A substrate processing method which comprises transferring substrates one by one from a cassette section to a processing section by a transfer mechanism at a timing of each predetermined cycle time, the cassette section having a cassette which houses the plurality of substrates constituting lots, the processing section including a plurality of solution processing units and a plurality of substrate carrying mechanisms; carrying the substrates in sequence along a cyclic route of the processing section by the substrate carrying mechanisms; executing a plurality of processes for the substrates in sequence; carrying the processed substrates from the processing section to the cassette section; and executing dummy dispense by at least one of the solution processing units in a period between a process of a preceding lot substrate and a process of a succeeding lot substrate, the method comprising:

stopping the transfer of a head substrate of the succeeding lot from the transfer mechanism to the substrate carrying mechanisms for a period which is an integral multiple of the cycle time, after a last substrate of the preceding lot is transferred from the cassette section to the processing section by the transfer mechanism, the substrate carrying mechanism moving along the cyclic route during the substrate transfer stop period without waiting until the completion of the dummy dispense of the solution processing unit;

executing the dummy dispense of a predetermined dummy dispense time by the solution processing unit during the substrate transfer stop period; and transferring the head substrate of the succeeding lot to the processing section by the transfer mechanism after the dummy dispense.

2. The method according to claim 1, further comprising:

making a recipe to control an operation of each of the transfer mechanism, the substrate carrying mechanisms and the solution processing units and a recipe to define initial conditions;

storing the made recipes;

selecting the necessary recipe from the stored recipes;

setting the cycle time and the dummy dispense time based on the selected recipe;

obtaining the substrate transfer stop period based on the cycle time and the dummy dispense time; and controlling operations of the transfer mechanism, the substrate carrying mechanisms and the solution processing units by using the substrate transfer stop period, the cycle time and the dummy dispense time, thereby causing at least one of the solution processing units to execute the dummy dispense during the substrate transfer stop period.

3. The method according to claim 2, wherein the dummy dispense time is predicted based on the stored recipes, and the substrate transfer stop period is decided based on the predicted dummy dispense time and the cycle time.

4. The method according to claim 2, further comprising:

counting the number of the processed substrates; deciding execution timing of the dummy dispense based on the counted number of the processed substrates and the recipes; and executing the dummy dispense at the decided execution timing by the solution processing unit.

5. The method according to claim 4, wherein the number of the continuously processed substrates after the previous dummy dispense is counted, and based on the counted number, it is determined whether or not the next dummy dispense is executed.

6. The method according to claim 5, wherein the number of the continuously processed substrates is counted at the processing section or the cassette section.

7. The method according to claim 4, wherein a continuous processing time of the substrates is counted after the previous dummy dispense, and based on the counted time, it is determined whether or not the next dummy dispense is executed.

8. The method according to claim 1, further comprising:

detecting a place of the last substrate of the preceding lot in the processing section; and determining whether or not the next dummy dispense is executed based on a result of the detection.

9. The method according to claim 8, wherein in order to detect a step in which the last substrate of the preceding lot and the head substrate of the succeeding lot are present, the substrates actually flowing in the processing section are counted, and based on a result of the counting, it is determined whether or not the next dummy dispense is executed.

10. The method according to claim 2, further comprising:

selecting and calling a time interval between lots from the stored recipes;

deciding the execution timing of the dummy dispense based on the time interval between lots and the recipes; and executing the dummy dispense by the solution processing unit at the execution timing.

11. The method according to claim 2, further comprising:

selecting and calling a minimum wafer count from the stored recipes;

deciding the execution timing of the dummy dispense based on the minimum wafer count and the recipe; and executing the dummy dispense by the solution processing unit at the execution timing.

12. The method according to claim 2, further comprising:

selecting and calling a process recipe change timing from the stored recipes;

deciding the execution timing of the dummy dispense based on the process recipe change timing; and executing the dummy dispense by the solution processing unit at the execution timing.

13. The method according to claim 1, wherein the cycle time is from transfer of an n-th substrate in the cassette from the transfer mechanism to the substrate carrying mechanisms to transfer of a next (n+1)-th substrate in the cassette from the transfer mechanism to the substrate carrying mechanisms.

14. The method according to claim 1, wherein the cycle time is equivalent to one round of each of the substrate carrying mechanisms along the cyclic route.

* * * * *